(12) United States Patent
Pal

(10) Patent No.: US 10,292,316 B2
(45) Date of Patent: May 14, 2019

(54) POWER MODULE WITH INTEGRATED LIQUID COOLING

(71) Applicant: HAMILTON SUNDSTRAND CORPORATION, Charlotte, NC (US)

(72) Inventor: Debabrata Pal, Hoffman Estates, IL (US)

(73) Assignee: Hamilton Sundstrand Corporation, Charlotte, NC (US)

(*) Notice: Subject to any disclaimer, the term of this patent is extended or adjusted under 35 U.S.C. 154(b) by 0 days.

(21) Appl. No.: 15/698,722

(22) Filed: Sep. 8, 2017

(65) Prior Publication Data
US 2019/0082561 A1 Mar. 14, 2019

(51) Int. Cl.
| H01L 23/473 | (2006.01) |
| H05K 7/20 | (2006.01) |
| H01L 23/34 | (2006.01) |
| H05K 1/02 | (2006.01) |
| H02K 11/33 | (2016.01) |
| H05K 1/18 | (2006.01) |

(52) U.S. Cl.
CPC ......... *H05K 7/20927* (2013.01); *H02K 11/33* (2016.01); *H05K 1/0203* (2013.01); *H05K 7/209* (2013.01); *H05K 1/181* (2013.01); *H05K 2201/064* (2013.01); *H05K 2201/10166* (2013.01); *H05K 2201/10522* (2013.01)

(58) Field of Classification Search
CPC ...... H01L 2924/13055; H05K 7/20927; H05K 7/209; H05K 7/1432; H05K 7/2089; H05K 2201/066; H05K 7/20945; H05K 1/0203; H05K 1/181; H05K 2201/064; H05K 2201/10166; H05K 2201/10522; H05K 1/0204; H05K 7/205; H02K 11/33
See application file for complete search history.

(56) References Cited

U.S. PATENT DOCUMENTS

| 4,975,579 A | * | 12/1990 | Iwanaga | ................. H01T 19/00 250/324 |
| 5,504,378 A | * | 4/1996 | Lindberg | ............... H02M 7/003 257/678 |
| 5,892,279 A | | 4/1999 | Nguyen | |
| 5,966,291 A | * | 10/1999 | Baumel | .............. H05K 7/20927 165/80.3 |
| 7,564,129 B2 | | 7/2009 | Nakanishi et al. | |
| 7,798,833 B2 | * | 9/2010 | Holbrook | ................ B60R 25/00 174/72 B |
| 7,859,846 B2 | | 12/2010 | Hassani et al. | |
| 7,916,480 B2 | | 3/2011 | Woody et al. | |

(Continued)

*Primary Examiner* — James Wu
*Assistant Examiner* — Michael A Matey
(74) *Attorney, Agent, or Firm* — Carlson, Gaskey & Olds, P.C.

(57) ABSTRACT

A module has a first layer with a plurality of transistors mounted thereon. Circuit traces are configured to communicate current between the transistors outwardly of the module. A second layer is in operable communication with the first layer. A third layer is in operable communication with the second layer. A baseplate is in grounded communication with the third layer. A plurality of ribs are positioned between the third layer and the baseplate. The module is configured to allow fluid to flow between the third layer and the baseplate and around the plurality of ribs. A motor drive and a method are also disclosed.

12 Claims, 4 Drawing Sheets

(56) References Cited

U.S. PATENT DOCUMENTS

| | | | | |
|---|---|---|---|---|
| 8,149,579 B2* | 4/2012 | Jadric | ................ | H05K 7/20936 165/80.4 |
| 8,169,779 B2 | 5/2012 | Le et al. | | |
| 8,169,780 B2* | 5/2012 | Yoshino | ............. | H05K 7/20927 165/104.33 |
| 8,198,540 B2* | 6/2012 | Kuromitsu | .......... | H01L 23/3735 165/185 |
| 8,472,188 B2* | 6/2013 | Horiuchi | ............ | H05K 7/20927 165/80.4 |
| 8,488,315 B2* | 7/2013 | Herron | ............... | H05K 7/20927 165/104.11 |
| 8,927,873 B2* | 1/2015 | Hori | ................... | H01L 21/4878 174/252 |
| 8,963,321 B2* | 2/2015 | Lenniger | ............... | H01L 23/367 257/712 |
| 9,030,823 B2 | 5/2015 | Kim et al. | | |
| 9,041,183 B2* | 5/2015 | Liang | ................... | H01L 25/072 257/691 |
| 9,064,846 B2* | 6/2015 | Nagai | ................. | H01L 23/473 |
| 9,159,645 B2* | 10/2015 | Mori | ................... | H01L 23/473 |
| 2001/0014029 A1* | 8/2001 | Suzuki | ................. | H02M 7/003 363/141 |
| 2005/0214518 A1* | 9/2005 | Nagase | ............... | H01L 23/3735 428/210 |
| 2005/0253457 A1* | 11/2005 | Pierret | ................... | F02N 11/04 307/10.1 |
| 2006/0002087 A1* | 1/2006 | Bezama | ................... | F28F 3/12 361/699 |
| 2008/0291628 A1* | 11/2008 | Aoki | ..................... | H01L 23/473 361/699 |
| 2009/0229864 A1* | 9/2009 | Kuromitsu | .......... | H01L 23/3735 174/252 |
| 2010/0326750 A1* | 12/2010 | Murakami | .......... | B60L 11/1887 180/65.31 |
| 2010/0328893 A1* | 12/2010 | Higashidani | ....... | H05K 7/20927 361/702 |
| 2012/0250253 A1* | 10/2012 | Chou | .................. | H01L 23/3735 361/689 |
| 2012/0275205 A1* | 11/2012 | Nakatsu | .................. | B60L 11/00 363/141 |
| 2013/0147540 A1* | 6/2013 | Wu | ...................... | H01L 27/0883 327/382 |
| 2014/0252590 A1* | 9/2014 | Gohara | ............... | H01L 23/3735 257/715 |
| 2014/0347818 A1* | 11/2014 | Uhlemann | ............ | H01L 23/473 361/699 |
| 2015/0102480 A1* | 4/2015 | Nakagawa | ............ | H01L 23/473 257/714 |
| 2015/0138734 A1* | 5/2015 | Guo | ........................ | H01L 23/36 361/736 |
| 2015/0327353 A1* | 11/2015 | Dickover | ............ | H05K 7/2039 361/679.54 |
| 2016/0088720 A1* | 3/2016 | Willis | .................. | H05K 1/0206 361/709 |
| 2016/0129792 A1* | 5/2016 | Gohara | ................. | H01L 23/473 310/54 |
| 2016/0242313 A1* | 8/2016 | Singh | ..................... | H05K 1/184 |
| 2016/0343640 A1* | 11/2016 | Gohara | ................. | H01L 23/473 |
| 2016/0343641 A1* | 11/2016 | Hori | ..................... | H01L 23/473 |
| 2018/0027693 A1* | 1/2018 | Greenwood | ........... | F28F 13/08 361/690 |

* cited by examiner

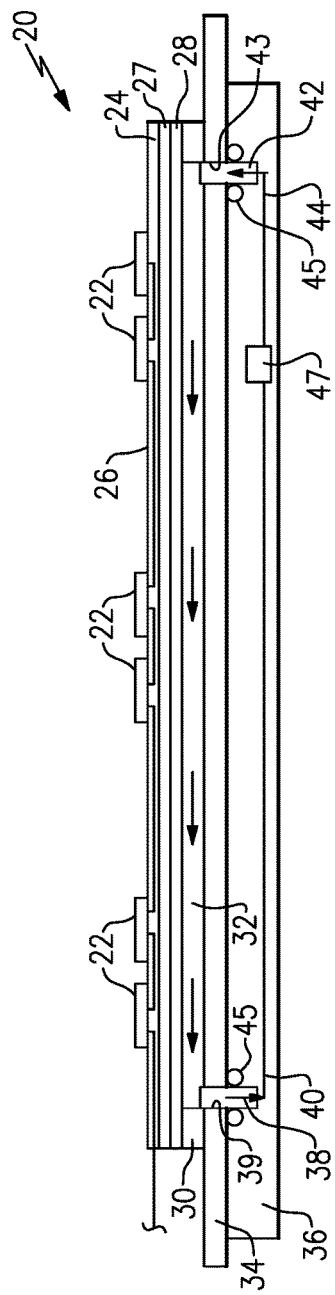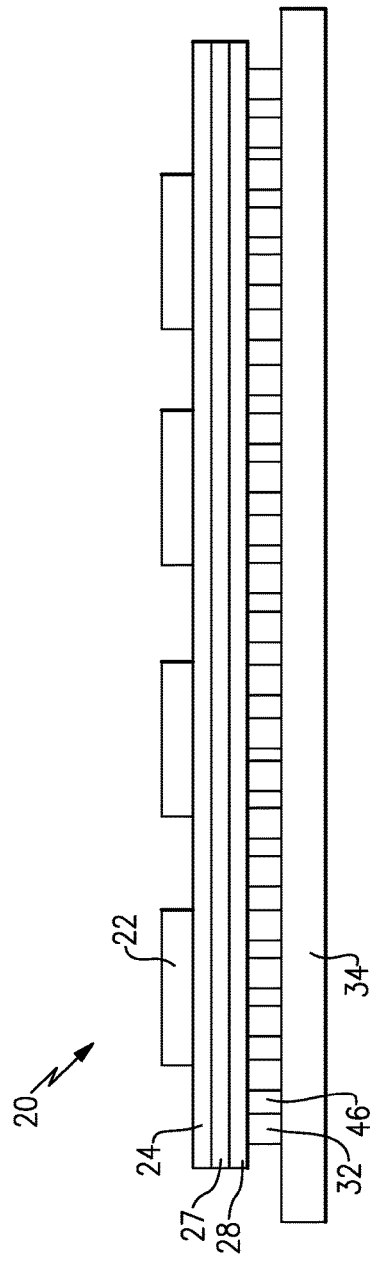

POWER MODULE WITH INTEGRATED LIQUID COOLING

BACKGROUND OF THE INVENTION

This application relates to a power module wherein liquid cooling is provided more efficiently.

Power electronics have become increasingly complex. One common system includes transistors, such as insulated gate bipolar transistors ("IGBTs"), which provide control to electric motors and associated inductors.

Typically, a circuit assembly including a plurality of such transistors includes a top direct bond copper layer, which includes circuit traces to communicate the transistors to various other components. There is an intermediate ceramic insulation circuit and then a bottom direct bond copper layer providing a ground.

Typically, there is a modular baseplate beneath the bottom direct bond copper layer and then a cold plate. The cold plate may be provided with cooling fluid circuitry. There may be a grease layer between the baseplate and the cold plate.

To provide the ground, the bottom direct bond copper layer has been soldered to the modular baseplate to provide the ground connection.

In the prior art, the cooling has not always been sufficient.

SUMMARY OF THE INVENTION

A module has a first layer with a plurality of transistors mounted thereon. Circuit traces are configured to communicate current between the transistors outwardly of the module. A second layer is in operable communication with the first layer. A third layer is in operable communication with the second layer. A baseplate is in grounded communication with the third layer. A plurality of ribs are positioned between the third layer and the baseplate. The module is configured to allow fluid to flow between the third layer and the baseplate and around the plurality of ribs.

A motor drive and a method are also disclosed.

These and other features may be best understood from the following drawings and specification.

BRIEF DESCRIPTION OF THE DRAWINGS

FIG. 1 schematically shows a transistor module.
FIG. 2 shows a detail of the FIG. 1 module.

DETAILED DESCRIPTION

Figure 3:
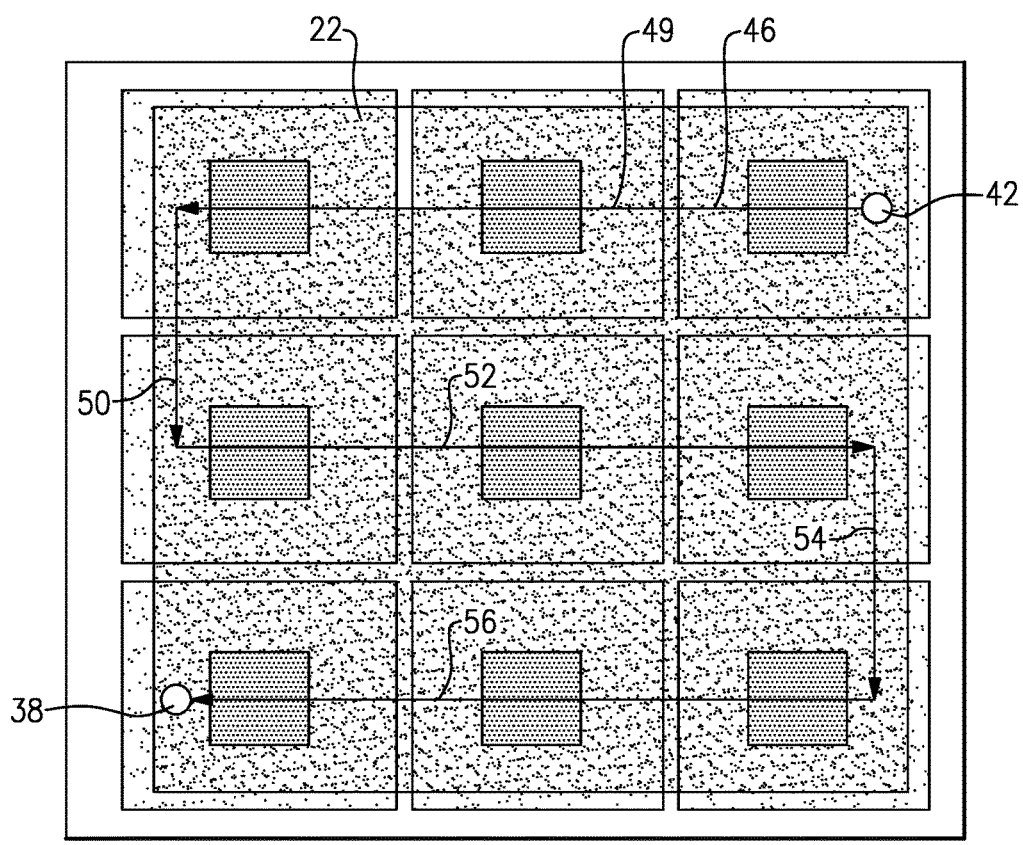
FIG. 3 shows another detail.

A module 20 is illustrated in FIG. 1 for providing cooling to a plurality of transistors 22. The transistors may be IGBTs or other types of transistors, such as metal oxide semiconductor field-effect transistors ("MOSFETs").

The module 20 typically includes an upper direct bond copper layer 24 which includes circuit traces 26, shown schematically. As known, the circuit traces communicate the transistors 22 to other components, such as motor drives, inductors, etc. outwardly of the module. While the layer 24 is disclosed as a direct bond copper layer, other metals may be utilized. As an example, molybdenum or beryllium copper may be utilized.

There is an intermediate insulation layer 27 typically formed of a ceramic, such as aluminum oxide or aluminum nitride. A bottom direct bond copper layer 28 is then connected between the insulation layer 27 and a baseplate 34. Again, while the layer 28 is disclosed as a direct bond copper layer, other appropriate metals may be utilized.

"Upper" and "bottom" as used for the layers are not to be interpreted as limiting the relative locations of the layers vertically. The module can be positioned with the layers in any relative location.

In this embodiment, there are outer closures 30 outwardly of fins or ribs 32 which are directly in contact with a face of the layer 28 opposed to the layer 24. The fins 32 may be formed integrally on the surface of the layer 28 and may be formed of the same material. The fins circulate a cooling fluid, such as from a cold plate 36.

As shown, there is an inlet 42 extending through an opening 43 in the baseplate 34 to pass a cooling fluid through channels between the ribs 32. A pump 47 is shown schematically. Pump 47 communicates to inlet 42 through passage 44. Also, an outlet 38 is shown extending through an opening 39 in the baseplate 34 and communicating with the pump 47 through passage 40. Of course, all of this structure is shown schematically. However, the provision of the cooling circuit in direct contact with the face of the layer 28 provides much more efficient and adequate cooling for the module 20 than has been provided in the prior art.

O-rings 45 seal the inlet 42 and outlet 38. The O-rings are compressed as the module 20 is secured to the cold plate 36.

In embodiments, the lower face of the ribs 32 is soldered to the baseplate 34 to provide a ground. Electrical ground is provided by the solder connection of the ribs 32 to baseplate 34. The base plate 34 is grounded to the cold plate 36 by bolted connections. Cold plates 36 typically have fluid or electrical interconnects that provides ground from the motor controller to a rack and panel where the motor controller is attached structurally.

As shown in FIG. 2, the ribs 32 provide a plurality of intermediate channels 46. This provides direct cooling to the layer 28.

FIG. 3 shows one embodiment wherein the channels 46 include a first channel, sub-portion 49 extending from the inlet 42 across several transistors 22 into a turning endpoint passage 50, which would also be provided in the ribs beneath the layer 28. The passage 50 communicates with passages 52 and an end passage 54 which, in turn, returns the cooling fluid back in an opposed direction to the outlet 38.

With the provision of this direct cooling on the layer 28, there is better heat management and more efficient removal of heat from the module 20.

Figure 4:
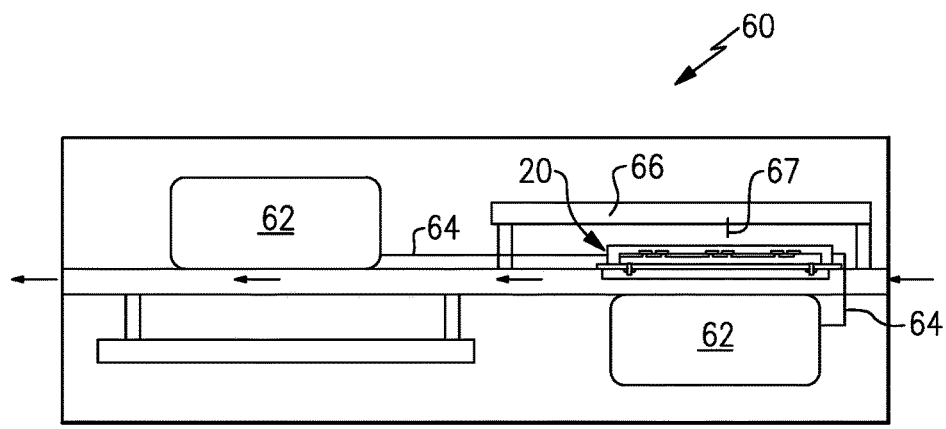
FIG. 4 shows the module of FIG. 1 integrated into a motor drive circuit.

FIG. 4 shows an embodiment 60 which provides a motor drive. The module 20 may communicate as shown schematically at 64 with inductor 62. A printed wiring board 66 provides gate drive power and control functions to the motor controller 20. The gate drive provides power and control to the gates to operate the module 20. Main current flow to and from the module 20 are provided by bus bars or feeder cables within the motor controller. Electrical connections 67 provide input and output currents to and from the motor controller.

Figure 5:
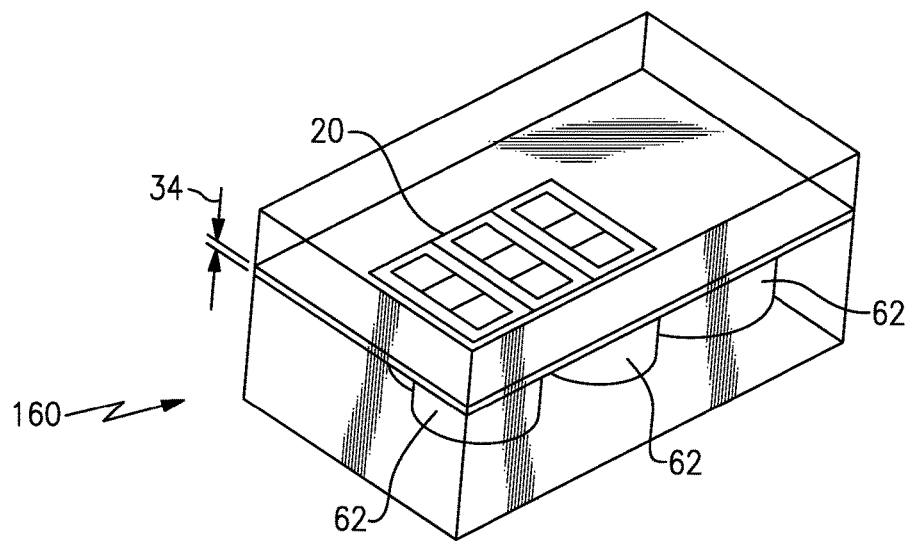
FIG. 5 shows an alternative arrangement.

FIG. 5 shows an alternative arrangement 160 wherein there are a plurality of inductors 62 associated with the module 20.

Figure 6:
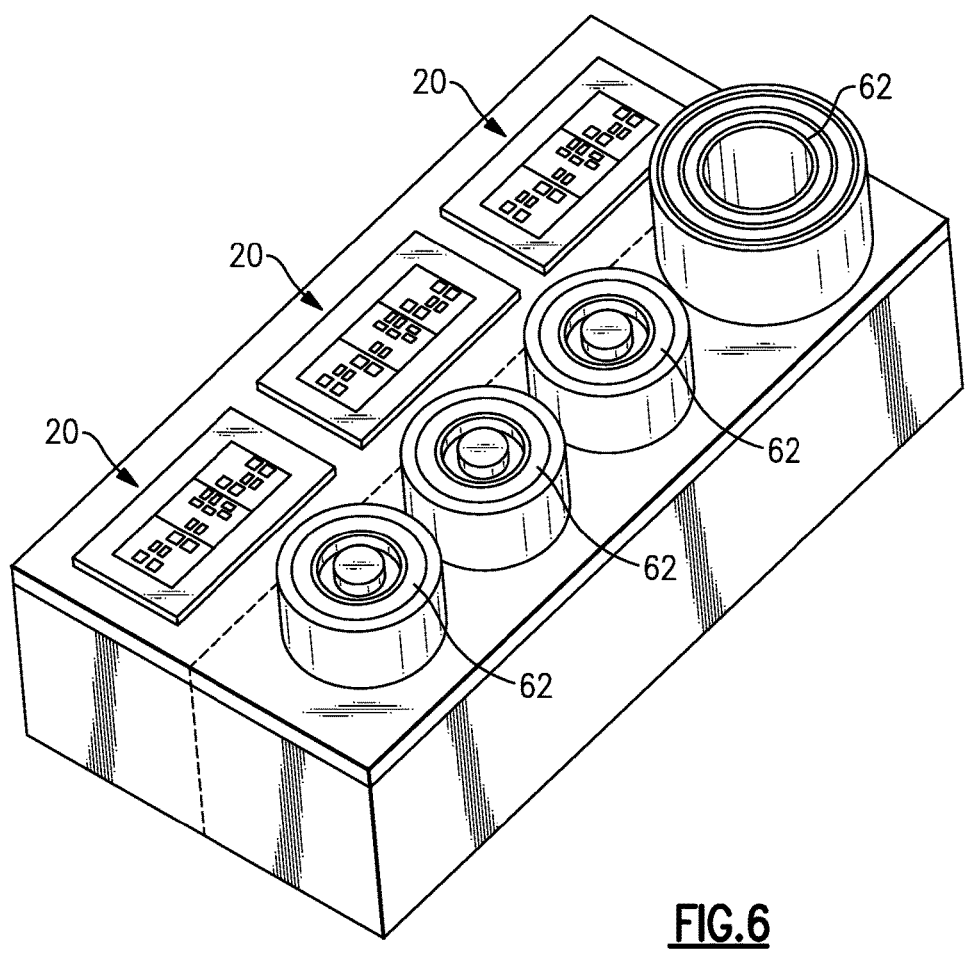
FIG. 6 shows yet another alternative arrangement.

FIG. 6 shows yet another arrangement where there are a plurality of modules 20 all associated with a plurality of inductors 62. Inductors 62 and capacitors form input and output filters for the motor controller. These are provided to meet the EMI (electromagnetic interference) and power quality requirements.

Stated another way, a module has a first layer 24 with a plurality of transistors 22 mounted thereon. Circuit traces are configured to communicate current between the transistors outwardly of the module. A second layer 27 is in operable communication with the first layer 24. A third layer 28 is in operable communication with the second layer 27. A baseplate 34 is in grounded communication with the third layer. A plurality of ribs 32 are positioned between the third layer and the baseplate. The module is configured to allow fluid to flow between the third layer and the baseplate and around the plurality of ribs.

A method of operating a module includes the steps of providing a first layer with a plurality of transistors mounted thereon. A second layer is in operable communication with the first layer. A third layer is in operable communication with the second layer. A base plate is in grounded communication with the third layer. A plurality of ribs is provided between the third layer and the base plate. Current from the plurality of transistors is communicated outwardly of the module. Fluid is circulated between the third layer and the base plate and around the ribs.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. A module comprising:
   a first layer having a plurality of transistors mounted thereon having circuit traces configured to communicate current between said transistors outwardly of said module;
   a second layer in operable communication with the first layer;
   a third layer in operable communication with the second layer;
   a baseplate in grounded communication with the third layer;
   a plurality of ribs positioned between the third layer and the baseplate, the module being configured to allow fluid to flow between the third layer and the baseplate and around the plurality of ribs;
   said ribs are formed integrally on said third layer, and of a common material with said third layer; and
   said ribs being soldered to said baseplate to provide a ground connection.

2. The module as set forth in claim 1, wherein said first layer and said third layer are both direct bond copper layers.

3. The module as set forth in claim 1, wherein said first layer and said third layer are formed of one of molybdenum and beryllium copper.

4. The module as set forth in claim 1, wherein there is a grid of said plurality of transistors and said cooling fluid passes along a first row of said transistors and then returns in an opposed direction across at least a second row of said transistors to an outlet.

5. The module as set forth in claim 1, further comprising O-ring seals sealingly engaged with an inlet connection and an outlet connection extending through said baseplate.

6. The module as set forth in claim 1, wherein said transistors are one of IGBTs and MOSFETs.

7. A motor drive comprising:
   a motor, at least one inductor and at least one said power control module including a plurality of transistors mounted on a first layer having circuit traces configured to communicate current between said transistors outwardly of said module, a second layer in operable communication with the first layer, a third layer in operable communication with the second layer, a baseplate in grounded communication with the third layer, and a plurality of ribs positioned between the third layer and the baseplate, the module being configured to allow fluid to flow between the third layer and the baseplate and around the plurality of ribs;
   said ribs are formed integrally on said third layer, and of a common material with said third layer; and
   said ribs being soldered to said baseplate to provide a ground connection.

8. The motor drive as set forth in claim 7, wherein said first layer and said third layer are both direct bond copper layers.

9. The motor drive as set forth in claim 7, wherein said first layer and said third layer are formed of one of molybdenum and beryllium copper.

10. The motor drive as set forth in claim 7, wherein there is a grid of said plurality of transistors and said cooling fluid passes along a first row of said transistors and then returns in an opposed direction across at least a second row of said transistors to an outlet.

11. The motor drive as set forth in claim 7, wherein there are O-ring seals on an inlet connection and an outlet connection extending through said baseplate and to supply said cooling fluid.

12. The motor drive as set forth in claim 7, wherein said transistors are one of IGBTs and MOSFETs.

* * * * *